United States Patent [19]

Ries

[11] Patent Number: 4,924,470
[45] Date of Patent: May 8, 1990

[54] LASER DIODE CONTROL APPARATUS

[76] Inventor: Gordon Ries, 1712 Huron Trail, Plano, Tex. 75075

[21] Appl. No.: 384,626

[22] Filed: Jul. 25, 1989

[51] Int. Cl.$^5$ .............................................. H01S 3/10
[52] U.S. Cl. ...................................... 372/26; 372/31; 372/32; 372/38
[58] Field of Search ...................... 372/26, 29, 31, 32, 372/38

[56] References Cited

U.S PATENT DOCUMENTS 4,243,951  1/1981  Wolkstein et al. .................... 372/26

Primary Examiner—James W. Davie

[57] ABSTRACT

Control of the amplitude of data modulation applied to a laser diode is critical to prevent excessive wavelength shift and resultant dispersion of the signal in the waveguide at high data rates. The present invention utilizes the intermodulation products of two low frequency signals superimposed upon the modulation signal to produce detected products which are separated into appropriate components and utilized to control the amplitude of the modulation signal such that its logic 0 level occurs at a given optimum point. A further complementary and interacting control loop is utilized to control the bias point or center point for this data modulation signal.

11 Claims, 2 Drawing Sheets

LASER DIODE CONTROL APPARATUS

THE INVENTION

The present invention is concerned generally with electronics and more specifically with laser diode means. Even more specifically, the present invention is concerned with the control of the amplitude of a data signal used to drive a laser diode and as a function thereof its logic 0 level to reduce the laser's wavelength shift, as logic states, are changed to a tolerable amount.

BACKGROUND

When a data pulse is applied to a laser diode, it switches the diode between a condition of OFF where very little current is flowing through the diode and there is no substantial lightwave output signal and an ON condition where a large amount of current is flowing through the diode causing it to lase and produce a lightwave or optical output signal. As the laser is changing between its OFF condition to its ON conditions, there is a shift in wavelength which shift is called "chirp". This term is borrowed from radar technology. This wavelength shift ceases very soon in the time it takes to change from an OFF to an ON condition but can produce enough components of frequencies other than the basic laser frequency to render detection of logic 0 and logic 1 states at a remote site difficult or impossible.

It is therefore essential that this chirp be held to manageable limits while still maximizing the laser output signal within the power limits of the diode.

A previous attempt to provide this control was illustrated in a Fraser U.S. Pat. No. 4,789,987, assigned to the same assignee as the present invention. This patent used amplitude modulation of two tones superimposed upon the data signal. However, the threshold position using this approach is sensitive to differential gain variation and an approach needed to be found which would provide a more stable control environment over a wider range of situations.

It is known in the art that the injection of two signals, such as is provided in the referenced Fraser patent, produces intermodulation products which would appear as sidebands on either side of the higher frequency signal of the two superimposed signals. All known prior art approaches to control have at a minimum ignored these products or in more sophisticated approaches, have tried to minimize or eliminate the products. The present invention, however, takes advantage of the intermodulation products to generate a signal proportional to the amplitude of the intermodulation product sidebands to adjust the amplitude of the data signal. Separate control loops are used to maintain the average power output and to normalize the amplitude of the 500 hertz signal used in the intermodulation process. The control of the amplitude of the data signal operates to control the level of the logic 0 portion of the data signal in accordance with a reference applied to that loop. The approach described minimizes the effects of the laser threshold position due to short term and long term gain variation in the laser and in the external circuitry.

It is an object of the present invention to provide an improved data modulation amplitude control of a laser circuit.

BRIEF DESCRIPTION OF THE DRAWINGS

Other objects and advantages of the present invention will be apparent from a reading of the specification and appended claims in conjunction with the drawings wherein:

DETAILED DESCRIPTION

Figure 1:
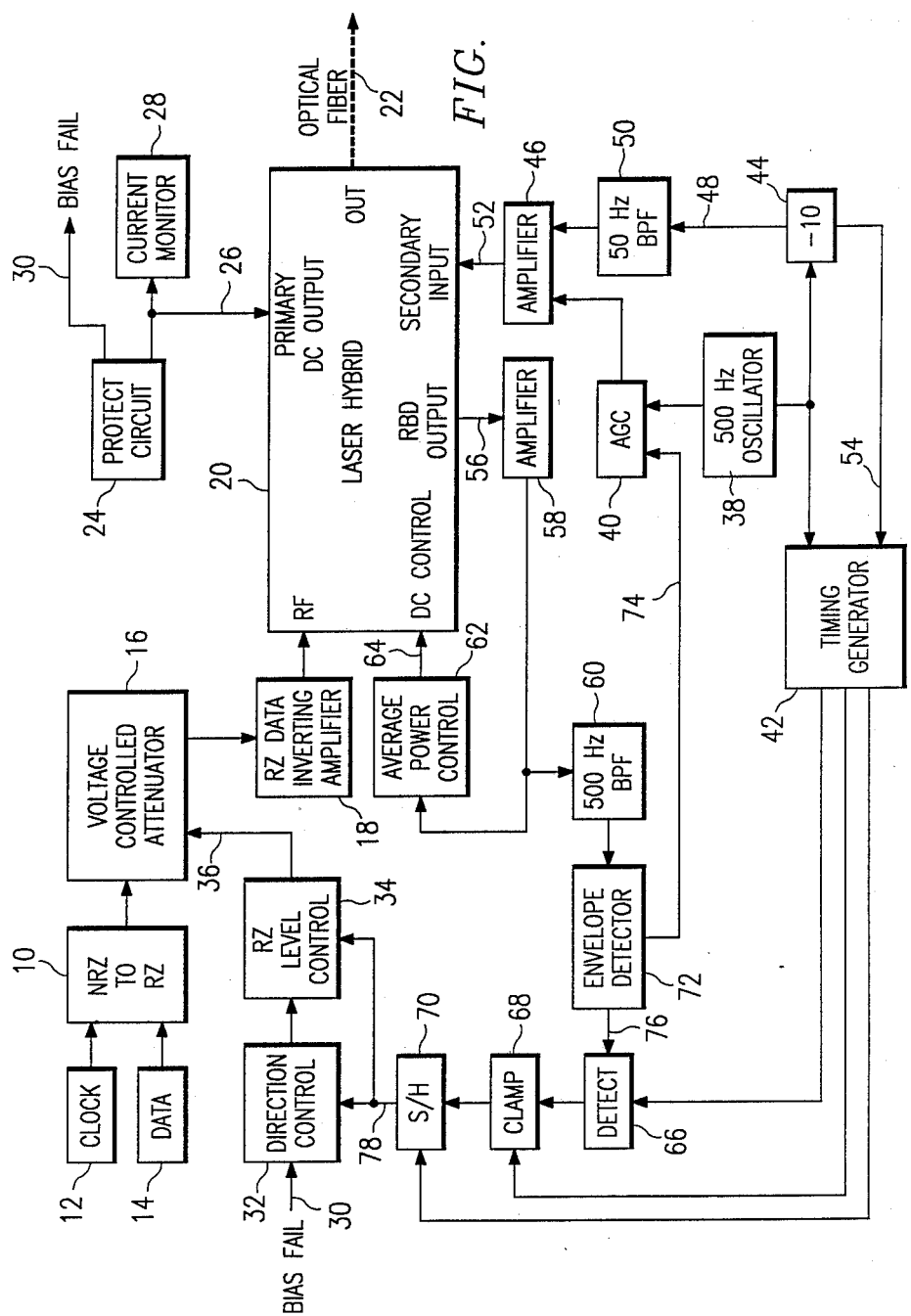
FIG. 1 is a block diagram of the overall inventive concept.

In FIG. 1 a non-retrun-to-zero to return-to-zero block 10 receives a clock signal from a block 12 and non-return-to-zero data from a block 14. The output of the return-to-zero block 10 is a square-wave data pulse which is applied to a voltage controlled attenuator 16 for providing a variable amplitude pulse to a return-to-zero data inverting amplifier 18. The output of block 18 is applied to a laser hybrid block 20 which provides an optical or light output signal to a fiber optic device represented as 22. A protect circuit 24 supplies DC inputs on a line 26 to the laser hybrid 20 and also to a current monitor device 28. A bias fail signal is provided on a lead 30 to a direction control block 32 to be used as part of the circuit initialization or start-up procedures for controlling the laser hybrid. The output of direction control block 32 is provided to a return-to-zero level control block 34 which provides an output as a control input on lead 36 to attenuator 16. An oscillator 38 which generates a 500 hertz signal supplies the signal to an AGC block 40, a timing generator block 42, and a divide by 10 block 44. An output of AGC block 40 supplies an amplitude controlled 500 hertz signal to an amplifier 46. A phase locked 50 hertz signal is output from the divide by 10 block 44 via a lead 48 to a 50 hertz bandpass filter 50 which supplies a further signal to amplifier 46. The composite of the 500 and 50 hertz signals is supplied from amplifier 46 via a lead 52 to a secondary input of laser hybrid 20. The divide by 10 circuit 44 supplies a further input on lead 54 to the timing generator 42. An RBD (rear beam detector) output of the laser hybrid is supplied on a lead 56 to an amplifier 58. Output 56 is indicative of the low frequency components of the optical output signal on lead 22. This signal is used for power control and other control functions of the circuit of FIG. 1. The output of amplifier 58 is supplied both to a bandpass filter 60 and to an average power control block 62. The average power control block 62 is of prior art design and is used to supply a DC control input on lead 64 to the hybrid block 20. The timing generator 42 supplies timing signals to a synchronous detector 66, a feed forward clamp circuit 68 and a sample and hold block 70. An output of bandpass filter 60 is provided to an envelope detector 72 which provides a DC signal indicative of the amplitude of the 500 hertz signal on a lead 74 to the AGC circuit 40 and provides a 50 hertz signal indicative of the intermodulation product amplitudes on a lead 76 to synchronous detector 66. An output of detector 66 is provided to clamp 68 as shown which provides an output to sample and hold 70 as shown. An output of sample and hold 70 is supplied both to the direction control block 32 and to the RZ level control block 34 on a lead 78.

Figure 2:
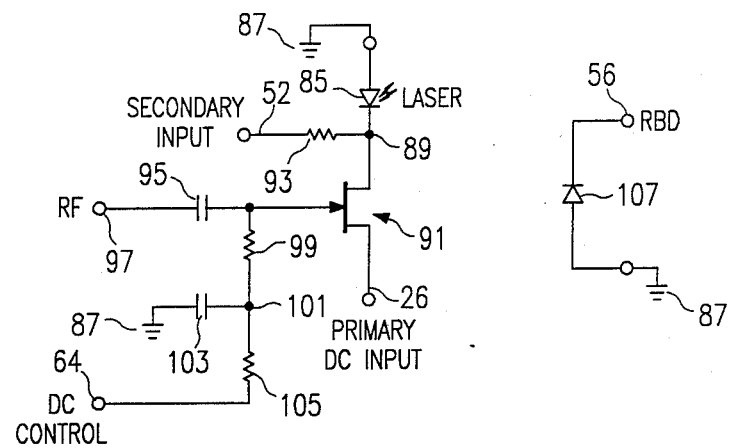
FIG. 2 is a schematic diagram of the laser hybrid block of FIG. 1.

In FIG. 2 a laser diode 85 is connected between ground or reference potential 87 and a junction point 89. An FET or field effect transistor 91 has its drain connected to junction point 89 and its source connected to a lead 26 as is used in FIG. 1 for the primary DC input. A resistor 93 is connected between junction point 89 and a secondary input labeled 52 as was also used in FIG. 1. A capacitor 95 is connected between a gate of FET 91 and an RF input 97 which corresponds to the RF input of FIG. 1 as received from block 18. A small resistor 99 is connected between the gate of FET 91 and a junction point 101. A capacitor 103 is connected between ground 87 and junction point 101 and a further resistor 105 is connected between junction point 101 and a DC control input 64. The size of resistor 99 is fairly small as compared to the magnitude of resistor 105. A rear beam detector diode 107 is connected between ground 87 and a rear beam detector output 56. By using the designators previously used in FIG. 1 where appropriate, the various connections with regard to the inputs and outputs of the laser hybrid 20 of FIG. 1 are immediately obvious.

Figure 3:
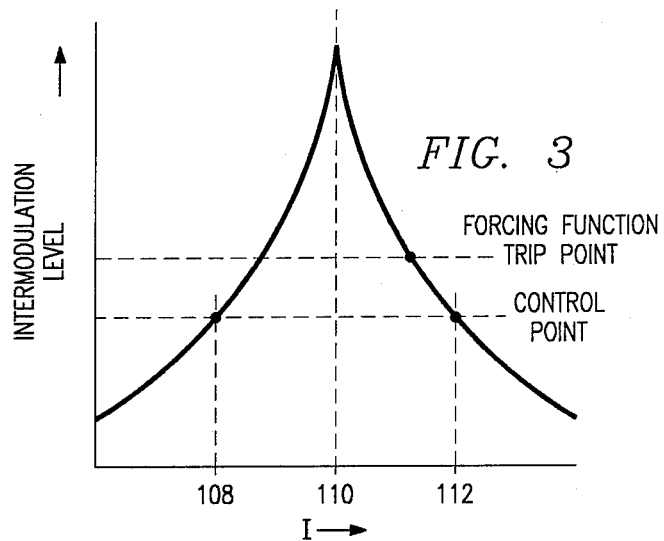
FIG. 3 is a diagram of the intermodulation level for various logic 0 level currents in the laser diode.

In FIG. 3 the horizontal axis is indicative of the current through the laser diode 89 when the RF input on 97 is attempting to place it in an OFF condition. The vertical axis is indicative of the level of the intermodulation products. The amplitude of these products increase as the OFF current approaches the non-linear "knee" of the laser diode with a maximum occuring at the point designated as 110. The point 110 would be representative of the greatest rate of change of slope on the low current side of the laser diode. A control point is shown at 108 which would provide an acceptable level of wavelength shift or chirp in the output signal from the laser. However, it will be noted that on the intermodulation product curve, there is a complementary control point designated as 112. Thus, circuitry is included within FIG. 1 to force the circuit to pass through the maximum 110 and down to the point 108 upon initialization so as to operate in an area around 108 once the feedback mechanism is stabilized.

Figure 4:
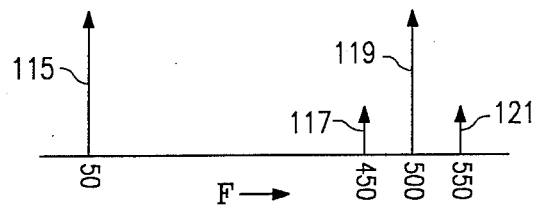
FIG. 4 is a frequency spectrum representation of the intermodulation products and the two low frequency signals used to produce these products.

FIG. 4 shows signal amplitude arrows 115, 117, 119 and 121 with each one representing the amplitude of signals at each of designated frequencies. The signals 115 and 119 are the two low frequency signals which are injected into the laser hybrid and the signals 117 and 121 are representative of the intermodulation products or sidebands introduced into the output on either side of the 500 hertz signal as sum and difference signals of the two signals 115 and 119. It is the signals 117 and 121 that are detected by envelope detector 72 and the output on lead 76 is indicative in amplitude of the total product appearing as symbols 117 and 121 in FIG. 4.

OPERATION

As previously indicated, there are prior art circuits to compensate for the aging characteristics of a laser diode wherein the amplitude of the data modulation is controlled in an attempt to obtain a substantially constant power output. As the data bit frequency rates rise, the effects of frequency dispersion for a given tolerance in the control apparatus becomes more critical. Thus, a control circuit which was satisfactory for prior art data rates may fail to meet specifications for higher frequency data rates.

The referenced frequency dispersion problem results in part from the action of a laser diode in changing from a logic 0 or nominally OFF condition to a logic 1 or ON condition where there is a frequency shift in the operation of the diode for current levels at and below the non-linear knee of the operation curve.

It is essential that the logic 0 condition of the diode be below the knee so as to change the magnitude of the light output sufficiently to be detected by a remote receiver. However, the further that the current flow is reduced below the current level at the knee, the more frequency (wavelength) shift occurs between the logic 0 and logic 1 conditions. Another approach to explaining this phenomenon, is that the diode carrier density is a function of current level, and the greater the carrier density change, the greater the wavelength shift. Thus, the driving signal must be controlled such that the logic 0 condition is maintained with a current flow which is a minimal amount on the low current side of the diode knee. It is the control of this current level in the prior art that has been insufficiently precise to provide appropriate operation at high gigabit data rates.

As previously mentioned, it is known that the introduction of low frequency signals superimposed upon the data signal for control purposes will introduce intermodulation effects of these low frequency signals in the knee of the diode operational curve. However, the prior art has tended to either ignore the intermodulation effects or has attempted to remove the signals generated by the intermodulation effects where they adversely affected the feedback control circuit chosen.

The intermodulation effect is maximum at the knee of the curve and falls to minimal amounts in the more linear portions on either side of the knee. In looking at FIG. 3, it will be noted that the point 110 represents the maximum non-linearity of the diode operational curve and produces maximum intermodulation products. The point 108 is chosen as being a logic 0 level on the low current side of the knee which has a sufficiently small amount of wavelength shift that specifications can be met at a given data rate. It will be noted, however, that if this level of intermodulation is chosen as a control point for a feedback loop, that there is a similar intermodulation level at 112 on the high current side of the knee. Thus, any control mechanism using intermodulation as its controlled parameter must make sure that the control circuit is disabled when the current level of the diode is in the vicinity of reference point 112 in FIG. 3.

For the purposes of discussion of the present circuit and as used in one embodiment of the invention, the low frequency signals superimposed upon the data signal may be the 50 hertz and 500 hertz signals illustrated in FIG. 4 with the intermodulation products being the sum and difference or the 450 and 550 hertz signals labeled 117 and 121 in FIG. 4. The optical output signal contains all four of these signals 115 through 121 as well as the high data rate signal. However, these signals 115-121 are of such a low frequency and low amplitude that they do not interfere with the detection operation at the data receiver. They may be detected by a reasonably inexpensive rear beam detector whose output is shown in FIG. 1 as output 56.

In one embodiment of the invention, the data 14 was in the form or format defined as non-return-to-zero (NRZ) and thus, this data was converted via block 10 from NRZ to return-to-zero (RZ) data. The amplitude of the data was then controlled by a voltage controlled attenuator 16 as part of a feedback loop to be discussed later before being amplified by amplifier 18 and applied to the laser hybrid 20. Within laser hybrid 20, and as shown in further detail in FIG. 2, the data is applied to the gate of FET 91 after being passed through capacitor 95. The FET 91 controls the current flow through the laser diode 85 thus controlling the light output of laser 85 as output on fiber 22 of FIG. 1. It is the front facet of the laser 85 that is used to provide the output on 22. The rear or back facet of laser 85 is monitored by photodiode 107. The output of this photodiode is a current proportional to the light impinging upon it. This current is converted to a voltage by the rear beam detector amplifier 58. The output of amplifier 58 is compared within control block 62 with an average set point to produce an error voltage and this error is integrated to produce an average power bias voltage which is fed back to DC control input 64 of FIG. 2. As will be noted, the output of amplifier 58 is also used in a further feedback loop to be discussed later as part of the laser modulation controller. The average power control loop including block 62 is used to maintain a constant laser average power output by varying the DC bias current through the laser driver FET 91. Although details are not shown specifically in FIG. 2, the FET transconductance variation is minimized using a secondary bias current applied via resistor 93 to the junction between laser diode 85 and FET 91. This bias current increases the current through the FET forcing it to operate in a region of constant transconductance. This secondary bias tap is also used as the injection point for the low frequency additive modulation used as part of the intermodulation control scheme. By injecting the low frequency signals at junction point 89, the FET is bypassed thereby eliminating any intermodulation effects due to the non-linearity of the FET transconductance. A prior art design soft start circuit comprising blocks 24 and 28 is utilized to prevent large transient currents from flowing through the laser 85 on power-up. This circuit also monitors the power supplies and will shut off the laser if any of the supplies should fail. An output labled bias fail 30 of the soft start circuit is used in the laser modulation controller to initialize the return-to-zero level control circuitry on power-up as shown in conjunction with direction control block 32.

The intermodulation control circuit comprises the oscillator 38 which produces a 500 hertz signal that is applied to the AGC block 40 and from there to amplifier 46. The 500 hertz signal from oscillator 38 is also divided by ten and applied as a square wave to bandpass filter 50 where it is formed into a sine wave and also applied to amplifier 46. By using the divide by ten block 44, the 500 hertz and the 50 hertz signals are basically phase locked to prevent low frequency ripple from appearing on the recovered intermodulation signal. The oscillator 38 and the divide by ten block 44 produce timing pulses which are used within timing generator 42 to apply signals to block 66, 68 and 70. The gain of the AGC circuit 40, is a function of the amplitude of the recovered 500 hertz signal and its direct voltage representative signal as obtained from envelope detector 72 and the amplitude of this signal is in turn a function of the external circuitry and the laser gain. The AGC block 40 eliminates intermodulation function variation due to the external circuitry gain variation and helps reduce the effect of laser gain variation. The rear beam detector amplifier 58 provides a signal to the bandpass filter 60 which removes the 50 hertz carrier and any low frequency return-to-zero data components. When the data is in the logic 0 level portion and thus in the laser threshold region, the intermodulation components appear as amplitude modulaton on the 500 hertz carrier. The output of the bandpass filter 60 is envelope detected by block 72. The output of the envelope detector 72 contains two signals. The first signal is a DC level proportional to the 500 hertz carrier level and is output on lead 74 to the AGC circuit 40 and a 50 hertz sine wave due to the intermodulation signal or, in other words, the sidebands shown as 117 and 121 in FIG. 4. The synchronous detector 66 samples the 50 hertz sine wave intermodulation signal at the positive and negative peak times to produce a 50 hertz square wave of the same amplitude. The detector 66 also serves as a lowpass filter rejecting any frequency components above 100 hertz. The output of the synchronous detector 66 is amplified and level shifted to remove the DC component due to the 500 hertz carrier. The positive level of this 50 hertz square wave is then clamped to zero volts by the feed forward clamp 68. The clamp 68 eliminates transient effects which tend to mask out the intermodulation signal during the data level changes. The clamp 68 also acts as a high-pass filter so the combined effect of the detector 66 and the clamp 68 is that of a 50 hertz bandpass filter. The level of the 50 hertz carrier and the gain of the feed forward clamp 68 are selected so that over the anticipated range of laser gain variation, the output of the clamp 68 will always go into the limiting at the peak of the intermodulation signal. Thus, the peak of the FIG. 3 signal does not appear at the output of clamp 68. This design eliminates the need for an intermodulation gain adjustment.

The sample and hold block 70 converts the negative level of the clamped 50 hertz square wave into a DC level. The output of sample and hold circuit 70 is compared in one embodiment of the invention to a 2.5 volt reference and an error voltage is generated. This error voltge is integrated by the RZ level control block 34 to produce a level control voltage applied on lead 36 to the attenuator 16. The return-to-zero data is adjusted to maintain the sample and hold output at the reference 2.5 volts also listed as the control point in FIG. 3.

When the device is initially powered-up, the bias fail signal 30 goes low (zero volts) forcing an integrator in the level control block 34 to the positive supply rail. This assures that the minimum return-to-zero data level will be applied to the laser within block 20. When the bias fail signal on lead 30 goes high, the return-to-zero level control integrator output within block 34 begins to sweep down towards the negative supply rail under the control of the direction control latch 32. As the return-to-zero level control voltage sweeps down, the return-to-zero data level begins to increase and when the logic 0 level reaches the laser threshold region, the intermodualtion signal appears. The intermodulation signal causes the output of the sample and hold block to increase, and when the output exceeds three volts, a direction control comparator within block 32 sets the direction control latch thereby removing the forcing function of FIG. 3 from the return-to-zero level control integrator in block 34 thereby allowing the sample and hold to gain control of the feedback circuit. The return-to-zero level of the data signal will continue to increase until the sample and hold output from block 70 drops back to the set point of 2.5 volts.

While I have shown one embodiment of the inventive concept, I wish to be limited not to the embodiment shown, but only to the concept of using intermodulation products in a control loop to control the amplitude of the data signal applied to a laser diode and as a part of that control, regulating the logic 0 level to a point just below the knee of the diode.

I claim:

1. Laser diode wavelength shift control apparatus comprising, in combination:

laser diode first means, including signal input means and signal output means, said first means changing in operational wavelength as a function of current passing therethrough, where the function includes a non-linear "knee";

signal source second means, connected to said input means of said first means, for passing a given frequency binary data first signal through said first means wherein the two logic levels alter current levels in said first means between opposite sides of said "knee";

intermodulation signal source third means, connected to said first means, for superimposing upon said data first signal intermodulation second and third signals, whose frequencies are different and are both low compared to the data rate of said first signal, the second and third signals creating maximum intermodulation signal levels when the current in said first means corresponds to said "knee";

second signal frequency amplitude detection and feedback fourth means, connected between said output means of said first means and said third means, for adjusting the amplitude of said second signal toward a value whereby the amplitude of said second signal frequency components appearing at said output means of said first means is maintained constant; and intermodulation signal frequency amplitude detection and feedback fifth means, connected between said output means of said first means and said second means, for adjusting the amplitude of said first signal toward a value whereby the amplitude of said intermodulation frequency components appearing at said output means of said first means is maintained constant.

2. Laser diode control apparatus comprising, in combination:

laser diode first means, including signal input means and signal output means, said first means changing in operational wavelength as a function of current passing therethrough, where the function includes a non-linear "knee";

signal source second means, connected to said input means of said first means, for passing a given frequency binary data first signal through said first means wherein the two logic levels alter current levels in said first means between opposite sides of said "knee";

intermodulation signal source third means, connected to said first means, for superimposing upon said data first signal intermodulation second and third signals, whose frequencies are different and are both low compared to said first signal, the second and third signals creating maximum intermodulation signal levels when the current in said first means corresponds to said "knee";

second signal frequency amplitude detection and feedback fourth means, connected between said output means of said first means and said third means, for adjusting the amplitude of said second signal toward a value whereby the amplitude of said second signal frequency components appearing at said output means of said first means is maintained constant; and intermodulation signal frequency amplitude detection and feedback fifth means, connected between said output means of said first means and said second means, for adjusting the amplitude of said first signal toward a value on the minimum current side of said "knee" wherein the magnitude of the intermodulation frequency components appearing at said output means of said first means is maintained constant.

3. The method of minimizing the operational wavelength shift of an active lasing diode comprising the steps of:

superimposing first and second low frequency signals upon a binary data third signal to form a fourth signal having logic 0 and logic 1 levels;

passing said fourth signal through a diode, having a non-linear rate of change of gain versus current "knee" with the logic 0 and logic 1 levels of said fourth signal causing corresponding minimum and maximum current levels in said diode to occur on opposite sides of said "knee";

detecting the value of intermodulation products generated at the output of said diode; and controlling the amplitude of said third signal to maintain the intermodulation products at a given level on said minimum current of said "knee" whereby the current through said diode is never turned completely OFF.

4. Apparatus for minimizing the operational wavelength shift of an active lasering diode comprising, in combination:

signal supplying first means for supplying first and second low frequency signals superimposed upon a binary data third signal to form a fourth signal having logic 0 and logic 1 levels;

diode second means, connected to said first means for receiving said fourth signal, said second means having a non-linear rate of change of gain versus current "knee" with the logic 0 and logic 1 levels of said fourth signal causing corresponding minimum and maximum current levels in said diode to occur on opposite sides of said "knee";

detection third means, connected to said second means, for detecting the value of intermodulation products generated at the output of said diode when current levels therein occur at levels where the gain is non-linear; and feedback fourth means, connected between said third and first means, for controlling the amplitude of said third signal to maintain the intermodulation products at a given level on said minimum current side of said "knee" whereby the current through said diode is never turned completely OFF.

5. Apparatus for minimizing the operational wavelength shift of an active lasering diode comprising, in combination:

signal supplying first means for supplying first and second low frequency signals superimposed upon a binary data third signal to form a fourth signal having logic 0 and logic 1 levels;

diode second means, connected to said first means for receiving said fourth signal, said means having a non-linear rate of change of gain versus current "knee" with the logic 0 and logic 1 levels of said fourth signal causing corresponding minimum and maximum current levels in said diode to occur on opposite sides of said "knee";

detection third means, connected to said second means, for detecting the value of intermodulation products generated at the output of said diode when current levels therein at levels where the gain is non-linear;

feedback fourth means, connected between said third and first means, for controlling the amplitude of said third signal to maintain the intermodulation products at a given level on said minimum current side of said "knee" whereby diode carrier density is minimally altered between diode ON and OFF conditions; and control fifth means, connected to between said second and first means, for adjusting the level of at least one of said first and second signals to maintain a substantially constant amplitude signal component, of the frequency corresponding to the frequency of the signal being adjusted, in the data signal being output by said second means.

6. Apparatus as claimed in claim 5 comprising, in addition:

average power control sixth means, connected to said second means, for adjusting the bias of said means to maintain a substantially constant power usage by said second means with time and signals levels.

7. Apparatus as claimed in claim 5 comprising, in addition:

forcing function sixth means, connected to said fourth means, for disconnecting said fourth means and independently causing the minimum and maximum logic levels of the data third signal to increase, upon initialization, whereby the intermodulation products are monitored until they exceed a given value, and thereby allowing said fourth means to further adjust the level of said third toward its stable value.

8. The method of minimizing the operational wavelength shift of an active lasing diode comprising the steps of:

superimposing first and second low frequency signals upon a binary data third signal to form a fourth signal having logic 0 and logic 1 levels;

passing said fourth signal through a diode, having a non-linear rate of change of gain versus current "knee" with the logic 0 and logic 1 levels of said fourth signal causing corresponding minimum and maximum current levels in said diode to occur on opposite sides of said "knee";

detecting the value of intermodulation products generated at the output of said diode; and controlling the amplitude of said third signal to maintain the intermodulation products at a given level on said minimum current side of said "knee" whereby the depth of modulation applied to the laser is controlled toward a value to minimize the wavelength shift between maximum and minimum values.

9. Control apparatus comprising, in combination:

power supply means, including first and second direct current terminal means;

FET (field effect transistor) means, including gate means, connected to the cathode of a laser diode means in series between said first and second terminal means of said power supply means;

RF modulation means and DC control means connected to said gate means of said FET means for supplying a radio frequency signal and a direct voltage signal thereto; and intermodulation signal input means, connected to said cathode of said laser diode means, for supplying two additional different frequency signals thereto, which additional signals are low in frequency as compared to the frequency of said radio frequency signal and which are phase locked one to the other.

10. The method of minimizing the operational wavelength shift of an active lasing diode comprising the steps of:

RF modulating a laser diode means with a high frequency binary data first signal to cause the current therethrough to vary between minimum and maximum current levels corresponding to logic 0 and logic 1 binary data signals where the minimum and maximum current levels fall on opposite sides of a non-linear rate of change of gain versus current "knee";

applying second and third low frequency signals directly to the cathode of said laser diode means to form superimposed intermodualtion frequency products of said second and third frequency signals in a basically RF modulated optical output signal;

detecting the value of intermodulation products generated at the output of said diode; and controlling the amplitude of said first signal to maintain the intermodulation products at a given level on said minimum current side of said "knee" whereby the depth of modulation applied to the laser is controlled toward a value to minimize the wavelength shift between maximum and minimum values.

11. Apparatus for controlling an active lasing diode comprising, in combination:

laser diode first means having a non-linear rate of change of gain versus current "knee" intermediate minimum current logic 0 and maximum current logic 1 levels of current flowing therethrough;

signal supplying second means for supplying first and second low frequency signals superimposed upon a binary data third signal to directly control current flow through said first means;

detection third means, connected to said first means, for detecting the value of intermodulation products generated at the output of said diode first means; and feedback fourth means, connected between said second and third means, for controlling the amplitude of said third signal to maintain the intermodulation products at a given level.

* * * * *